(12) United States Patent
Moon et al.

(10) Patent No.: US 11,631,723 B2
(45) Date of Patent: Apr. 18, 2023

(54) DISPLAY APPARATUS AND, APPARATUS AND METHOD OF MANUFACTURING THE SAME

(71) Applicant: Samsung Display Co., Ltd., Yongin-Si (KR)

(72) Inventors: Jaesuk Dustin Moon, Yongin-si (KR); Sangshin Lee, Yongin-si (KR); Seungjin Lee, Yongin-si (KR); Eunjoung Jung, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 353 days.

(21) Appl. No.: 17/103,362

(22) Filed: Nov. 24, 2020

(65) Prior Publication Data

US 2021/0083027 A1    Mar. 18, 2021

Related U.S. Application Data

(62) Division of application No. 16/397,974, filed on Apr. 29, 2019, now Pat. No. 10,879,326.

(30) Foreign Application Priority Data

Jul. 27, 2018    (KR) .......................... 10-2018-0087999

(51) Int. Cl.
| H01L 27/32 | (2006.01) |
| H01L 51/00 | (2006.01) |
| H01L 51/56 | (2006.01) |
| H01L 51/52 | (2006.01) |

(52) U.S. Cl.
CPC ........ *H01L 27/3246* (2013.01); *H01L 27/326* (2013.01); *H01L 51/0011* (2013.01); *H01L 51/5253* (2013.01); *H01L 51/56* (2013.01)

(58) Field of Classification Search
None
See application file for complete search history.

(56) References Cited

U.S. PATENT DOCUMENTS

| 9,975,134 B2 * | 5/2018 | Ko .......................... H01J 9/24 |
| 2008/0315756 A1 | 12/2008 | Jeon et al. |
| 2014/0084257 A1 | 3/2014 | Kim et al. |
| 2014/0134762 A1 | 5/2014 | Kakiuchi et al. |
| 2014/0291637 A1 | 10/2014 | Yim et al. |
| 2014/0332765 A1 | 11/2014 | Kim |
| 2017/0133444 A1 | 5/2017 | Lee et al. |
| 2018/0006267 A1 | 1/2018 | Sakamoto |
| 2018/0061722 A1 | 3/2018 | Byun et al. |
| 2018/0151834 A1 | 5/2018 | Kanaya |
| 2018/0159076 A1 | 6/2018 | Yun et al. |

(Continued)

FOREIGN PATENT DOCUMENTS

| JP | 2013-134937 A | 7/2013 |
| KR | 10-0833772 B1 | 5/2008 |
| KR | 10-2014-0038827 A | 3/2014 |

(Continued)

*Primary Examiner* — Evren Seven
(74) *Attorney, Agent, or Firm* — Innovation Counsel LLP (57) ABSTRACT

One or more embodiments include a display apparatus including an opening, an apparatus for manufacturing the display apparatus, and a method of manufacturing the display apparatus capable of reducing generation of gas or foreign matter.

9 Claims, 9 Drawing Sheets

(56) References Cited

U.S. PATENT DOCUMENTS

2018/0183008 A1   6/2018  Song et al.

FOREIGN PATENT DOCUMENTS

| KR | 10-2014-0133113 A | 11/2014 |
| KR | 10-2014-0134158 A | 11/2014 |
| KR | 10-2015-0071321 A | 6/2015 |
| KR | 10-2015-0111337 A | 10/2015 |
| KR | 10-1659960 B1 | 9/2016 |

* cited by examiner

DISPLAY APPARATUS AND, APPARATUS AND METHOD OF MANUFACTURING THE SAME

CROSS-REFERENCE TO RELATED APPLICATION

This application is a divisional application of U.S. patent application Ser. No. 16/397,974 filed on Apr. 29, 2019, which claims priority under 35 USC § 119 to Korean Patent Application No. 10-2018-0087999, filed on Jul. 27, 2018, in the Korean Intellectual Property Office, the disclosures of which are incorporated herein in their entirety by reference.

BACKGROUND

1. Field

One or more embodiments relate to an apparatus and method, and more particularly, to a display apparatus, an apparatus for manufacturing the display apparatus, and a method of manufacturing the display apparatus.

2. Description of the Related Art

Recently, a display apparatus has been used for various purposes. Also, since a thickness of a display apparatus and a weight of the display apparatus are reduced, a utilization range of the display apparatus has been increasing.

In a display apparatus, various functions attached to or linked to the display apparatus are being added while increasing a display area. In order to add various functions while increasing the display area, there has been suggested a display apparatus in which an opening is provided in a display area.

SUMMARY

In a display apparatus having an opening, when a laser beam or a mechanical polishing is used after arranging each layer in order to generate the opening, gas or foreign matter may be generated while removing some layers. One or more embodiments include a display apparatus including an opening, an apparatus for manufacturing the display apparatus, and a method of manufacturing the display apparatus capable of reducing generation of gas or foreign matter. However, the above technical feature is exemplary, and the scope of the present disclosure is not limited thereto.

Additional aspects will be set forth in part in the description which follows and, in part, will be apparent from the description, or may be learned by practice of the presented embodiments.

According to one or more embodiments, a display apparatus includes: a substrate including an opening region and a display area at least partially surrounding the opening region; a plurality of display elements on the display area, each of the plurality of display elements including a pixel electrode, an opposite electrode, and an intermediate layer between the pixel electrode and the opposite electrode; and a thin film encapsulation layer including at least one organic encapsulation layer and at least one inorganic encapsulation layer. The thin film encapsulation layer covers the plurality of display elements. The opposite electrode and a functional layer of the intermediate layer are entirely arranged on the display area. At least one of the opposite electrode and the functional layer is partitioned into a plurality of regions connected to each other on the display area. An overlapping region is provided between two adjacent regions from among the plurality of regions. The overlapping region is obtained by overlapping at least one of the opposite electrode and the functional layer on each region with at least one of the opposite electrode and the functional layer on an adjacent region.

A boundary of the overlapping region at least partially may have a concavo-convex shape.

The concavo-convex shape may be atypical.

According to one or more embodiments, an apparatus for manufacturing a display apparatus including an opening region and a display area at least partially surrounding the opening region is presented. The apparatus includes a chamber; a source portion; a first mask assembly, and a second mask assembly. The source portion is arranged in the chamber and is configured to supply a deposition material into the chamber. The first mask assembly is configured to be arranged in the chamber and comprises a first opening, through which the deposition material is configured to pass. The second mask assembly is configured to be selectively arranged in the chamber to be replaceable with the first mask assembly, the second mask assembly comprising a second opening, through which the deposition material is configured to pass. The deposition material is configured to pass through the first opening to be deposited on a part of a display substrate to form a first deposition area surrounding a part of the opening region and is configured to pass through the second opening to be deposited on a different part of the display substrate to form a second deposition area surrounding a different part of the opening region and different from the first deposition area. The first deposition area and the second deposition area are connected to each other to form one display area on the display substrate.

At least one of a portion of the first opening corresponding to a boundary of the first deposition area and a portion of the second opening corresponding to a boundary of the second deposition area may have a concavo-convex shape, wherein the portion of the first opening and the portion of the second opening may face each other.

The concavo-convex shape may be atypical.

A concavo-convex shape of the first opening and a concavo-convex shape of the second opening may be coupled to each other.

The first deposition area and the second deposition area at least partially may overlap with each other.

At least one of the first mask assembly and the second mask assembly may be configured to be arranged sequentially in the chamber.

The first mask assembly may include a first protrusion protruding towards an inner portion of the first opening and configured to block the deposition material.

The second mask assembly may include a second protrusion protruding towards an inner portion of the second opening and configured to block the deposition material.

According to one or more embodiments, a method of manufacturing a display apparatus, the method includes: arranging a display substrate and a first mask assembly in a chamber; depositing a deposition material on a part of the display substrate through a first opening of the first mask assembly to form a first deposition area surrounding a part of an opening region; arranging a second mask assembly in the chamber after withdrawing the first mask assembly out of the chamber; and depositing the deposition material on a different part of the display substrate through a second opening of the second mask assembly to form a second deposition area surrounding a different part of the opening region. The first deposition area and the second deposition area are connected to each other to at least partially surround the opening region.

The first deposition area and the second deposition area may at least partially overlap with each other.

At least one of a boundary of the first deposition area overlapping with the second deposition area and a boundary of the second deposition area overlapping with the first deposition area may have a concavo-convex shape.

The concavo-convex shape may be atypical.

A concavo-convex shape in a boundary of the first deposition area and a concavo-convex shape in a boundary of the second deposition area may be coupled to each other.

The first mask assembly may include a first opening corresponding to the first deposition area and a first protrusion protruding towards an inner portion of the first opening to block a part of the opening region.

A boundary of the first opening connected to the first protrusion may have a concavo-convex shape.

The second mask assembly may include a second opening corresponding to the second deposition area and a second protrusion protruding towards an inner portion of the second opening to block a part of the opening region.

A boundary of the second opening connected to the second protrusion may have a concavo-convex shape.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. The attached drawings for illustrating one or more embodiments are referred to in order to gain a sufficient understanding, and the merits thereof. However, the embodiments may have different forms and should not be construed as being limited to the descriptions set forth herein.

The exemplary embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, it will be understood when layers, areas, or elements or the like are referred to as being "connected," they can be directly connected or an intervening portion may be present between layers, areas or elements. For example, when layers, areas, or elements or the like are referred to as being "electrically connected," they can be directly electrically connected, or layers, areas or elements may be indirectly electrically connected and an intervening portion may be present.

Figure 1:
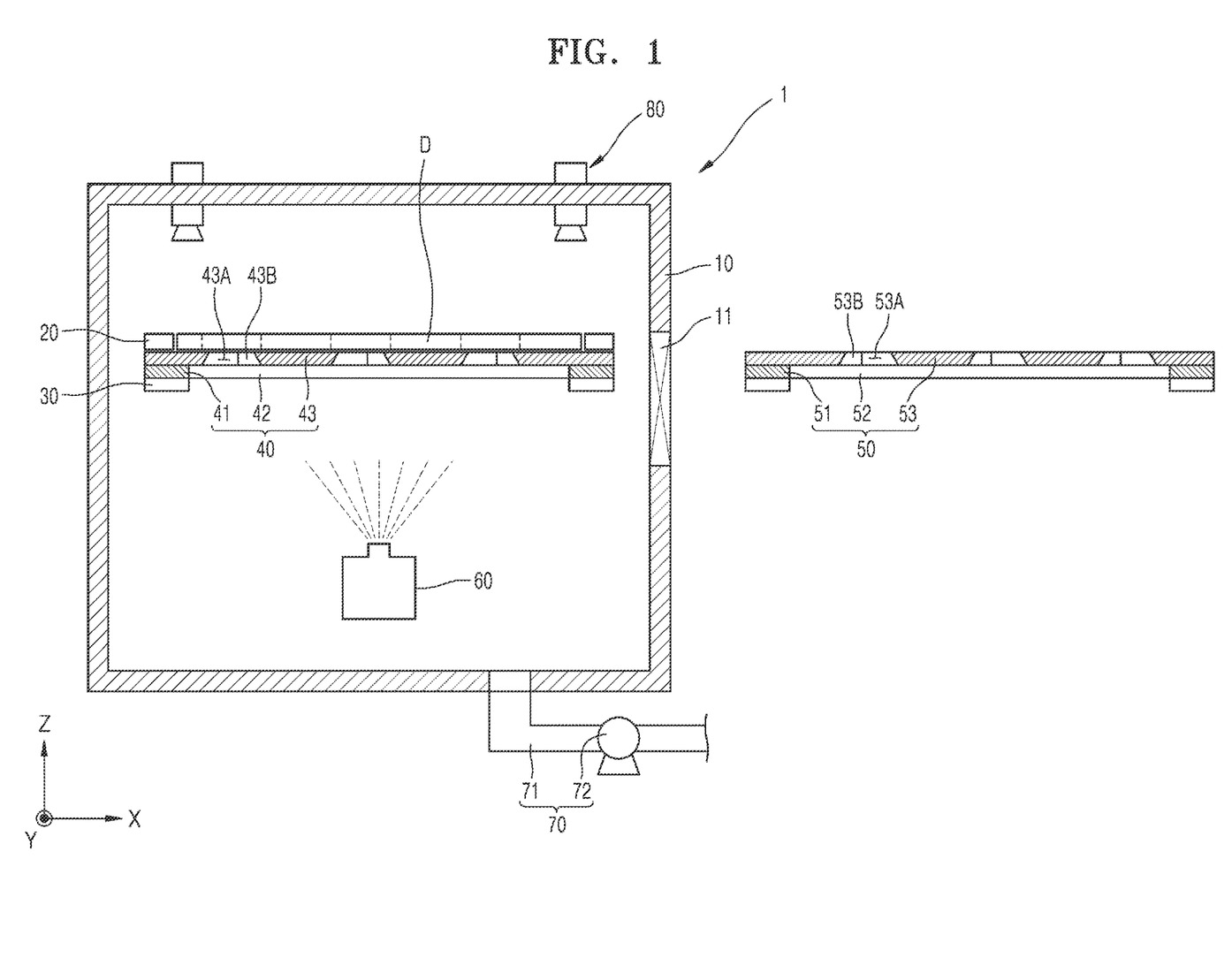
FIG. 1 is a cross-sectional view of an apparatus for manufacturing a display apparatus, according to an embodiment.
Figure 2:
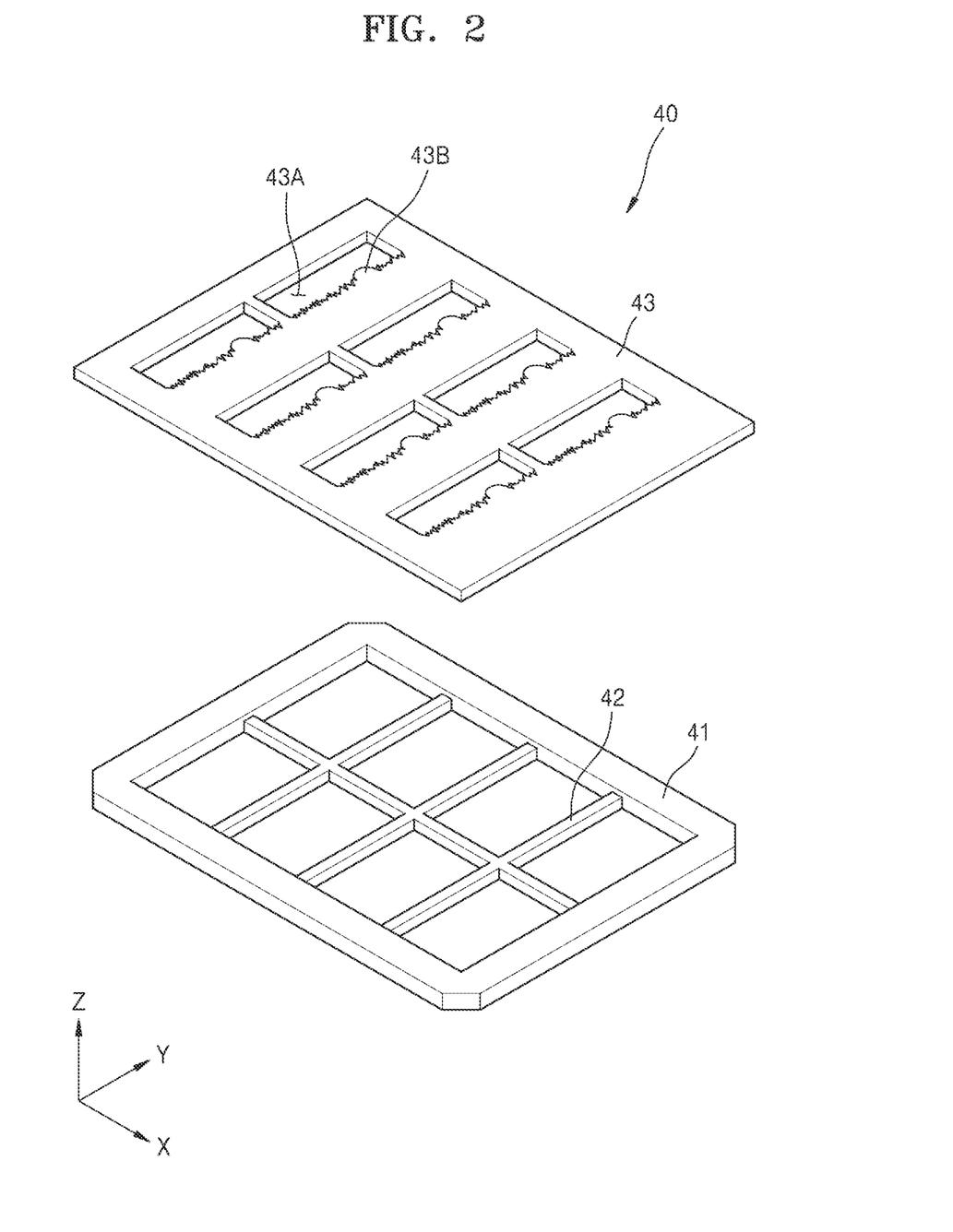
FIG. 2 is a perspective view of a first mask assembly of FIG. 1.
Figure 3:
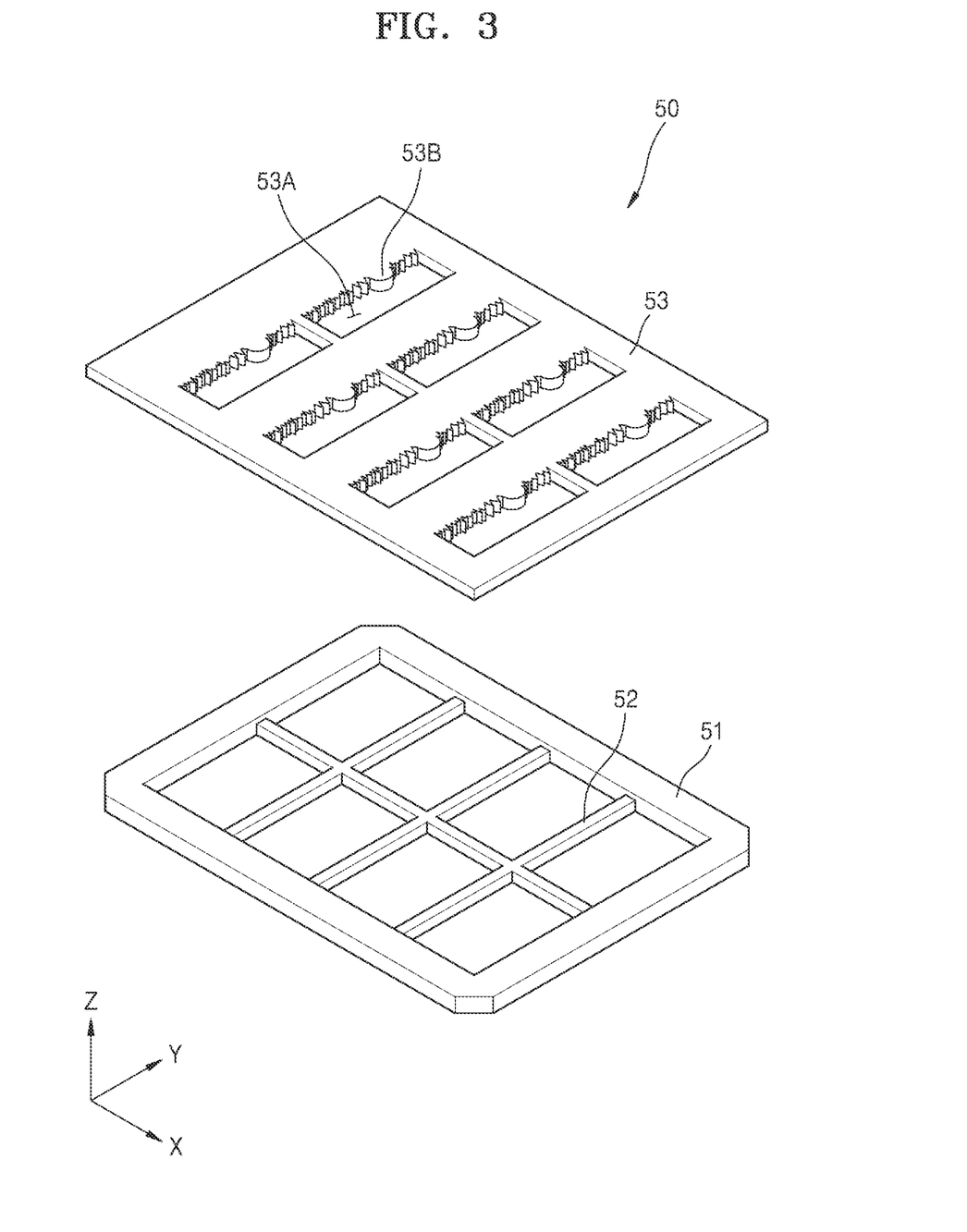
FIG. 3 is a perspective view of a second mask assembly of FIG. 1.

FIG. 1 is a cross-sectional view of an apparatus 1 for manufacturing a display apparatus, according to an embodiment. FIG. 2 is a perspective view of a first mask assembly 40 of FIG. 1. FIG. 3 is a perspective view of a second mask assembly 50 of FIG. 1.

Referring to FIGS. 1 to 3, the apparatus 1 for manufacturing a display apparatus may include a chamber 10, a first supporter 20, a second supporter 30, the first mask assembly 40, the second mask assembly 50, a source portion 60, a pressure adjuster 70, and a vision portion 80.

The chamber 10 may include an internal space in which a deposition is performed. Here, the chamber 10 may include an opening portion, where a gate valve 11 is located to close or open the opening portion.

The first supporter 20 is arranged in the chamber 10 to support a display substrate D. The first supporter 20 may have various shapes. For example, the first supporter 20 may be fixed in the chamber 10, and the display substrate D may be mounted on the first supporter 20. As another embodiment, the first supporter 20 may be provided as a shuttle that may linearly move in the chamber 10. As another embodiment, the first supporter 20 may be provided as a clamp arranged in the chamber 10 to hold the display substrate D. As another embodiment, the first supporter 20 may be provided in the chamber 10, and may include an electrostatic chuck or an adhesive chuck for fixing the display substrate D. However, the first supporter 20 is not limited to the above examples, and may include any device or structure that may support the display substrate D. Hereinafter, a case in which the first supporter 20 is fixed in the chamber 10 and the display substrate D is mounted on the first supporter 20 will be described in detail for convenience of description.

The first mask assembly 40 or the second mask assembly 50 may be on the second supporter 30. Here, the second supporter 30 may adjust a position of the first mask assembly 40 or the second mask assembly 50. For example, the second supporter 30 may elevate or rotate the first mask assembly 40 or the second mask assembly 50 a predetermined distance, or may linearly move the first mask assembly 40 or the second mask assembly 50 in a direction.

The first mask assembly 40 may selectively transmit a deposition material. For example, the first mask assembly 40 may include one first opening 43A for transmitting the deposition material. The deposition material that has passed through the first opening 43A may be deposited on a region of the display substrate D. As another embodiment, the first mask assembly 40 may include a plurality of first openings 43A that transmit the deposition material. In this case, the display substrate D is partitioned into a plurality of regions, and a part in each of the plurality of regions may correspond to each of the first openings 43A. In this case, the plurality of regions of the display substrate D are separated from one another after depositing the deposition material, and then each region may be manufactured as one display apparatus. Hereinafter, a case in which the first mask assembly 40 includes the plurality of first openings 43A will be described in detail for convenience of description.

The first mask assembly 40 may include a first mask frame 41, a first support frame 42, and a first mask 43. Here, the first mask frame 41 may have a space at a center thereof. The first mask frame 41 may have a window frame shape. The first support frame 42 may be arranged on a surface of the first mask frame 41. Here, the first support frame 42 may be provided as a grating on the first mask frame 41. The first support frame 42 may be separately provided from the first mask frame 41 to be coupled to the first mask frame 41.

As another embodiment, the first support frame 42 may be integrally provided with the first mask frame 41. In the above case, the first support frame 42 may partition an internal space of the first mask frame 41 and may support the first mask 43. The first mask 43 may be arranged on the first mask frame 41. Here, the first mask 43 may include the plurality of first openings 43A respectively corresponding to the regions of the display substrate D. Each of the plurality of first openings 43A may have a shape corresponding to a part of a display area (not shown) in each of the regions of the display substrate D. Here, the first mask 43 may include first protrusions 43B, each protruding from a boundary of each first opening 43A towards an inner portion of the first opening 43A. In this case, the first protrusion 43B may define a part of a first opening region (not shown) that will be described later. The first protrusion 43B may have various shapes. For example, the first protrusion 43B may have a polygonal shape, a semi-circular shape, half ellipse, etc. The above shape of the first protrusion 43B may vary depending on a shape of the first opening region.

The first opening 43A may at least partially have a concavo-convex shape on a boundary thereof. For example, at least a part of the boundary of the first opening 43A may have a protrusion protruding inward into the first opening 43A and a recess depressed in a direction away from the inside of the first opening 43A.

In the above case, there may be a plurality of protrusions and a plurality of recesses, and the protrusions and recesses may be alternately arranged. The plurality of protrusions may have various shapes. For example, the plurality of protrusions may have constant sizes, but in another embodiment, at least two of the plurality of protrusions may have different sizes from each other. The plurality of protrusions may have constant shapes, but in another embodiment, at least two of the plurality of protrusions may have different shapes from each other. The plurality of protrusions may be arranged in a constant pattern, but in another embodiment, the plurality of protrusions may be arranged in at least two different patterns.

When the protrusions are provided as above, the recesses may be provided similarly to the protrusions. For example, at least one of a size, a shape, and a pattern of the recess may be the same as or different from those of the other recesses. In this case, when the concavo-convex shape in at least a part of the first opening 43A is atypical, it may denote that the concavo-convex shape may include at least two protrusions, wherein the two protrusions have sizes, shapes, and patterns, at least one of which is different from that of the other. Also, when the concavo-convex shape in at least a part of the first opening 43A is atypical, it may denote that the concavo-convex shape may include at least two recesses, wherein the two recesses have sizes, shapes, and patterns, at least one of which is different from that of the other.

From among the plurality of protrusions, the largest protrusion may have a width that is twice the thickness of the first mask 43 or less. When the largest protrusion from among the plurality of protrusions has a width that exceeds twice the thickness of the first mask 43, a probability that a user may recognize a boundary of a first deposition area DA1 (see FIG. 4 for example) manufactured through the first opening 43A may increase. Here, a width of a protrusion may be defined as a distance between a starting point of the protrusion from the first mask 43 to a point that is farthest from the starting point.

One first mask 43 may be provided or a plurality of first masks 43 may be provided. When a plurality of first masks 43 are provided, the plurality of first masks 43 may be provided as sheets and arranged on the first mask frame 41 to be adjacent to one another. Hereinafter, a case in which one first mask 43 is provided will be described in detail for convenience of description.

The second mask assembly 50 may include a second mask frame 51, a second support frame 52, and a second mask 53. Here, the second mask frame 51 and the second support frame 52 are the same as or similar to the first mask frame 41 and the first support frame 42, respectively, and thus detailed descriptions thereof are omitted.

The second mask 53 may include a plurality of second openings 53A and a plurality of second protrusions 53B protruding respectively in the second openings 53A. In this case, a deposition material that has passed through each of the second openings 53A may form one display area with the deposition material that has passed through each of the first openings 43A.

In this case, each of the second openings 53A may have a boundary, at least a part of which has a concavo-convex shape. Here, the part where the concavo-convex shape is provided in the boundary of the second opening 53A may be coupled to the part where the concavo-convex shape is provided in the boundary of the first opening 43A.

That is, when the part having the concavo-convex shape in the boundary of the second opening 53A meets the part having the concavo-convex shape in the boundary of the first opening 43A, the sizes and shapes of the protrusions in the concavo-convex shape of the first opening 43A may be identical with the sizes and shapes of the corresponding recesses in the concavo-convex shape of the second opening 53A, and sizes and shapes of the protrusions in the concavo-convex shape of the second opening 53A may be identical with sizes and shapes of the corresponding recesses in the concavo-convex shape of the first opening 43A. When the second protrusion 53B is combined with the shape of the first protrusion 43B, the combined shape may be identical with or similar to the shape of the first opening region. In this case, a combined size of the first protrusion 43B and the second protrusion 53B may be greater than that of the first opening region.

The source portion 60 accommodates the deposition material, and may sublimate or vaporize the deposition material. Here, the source portion 60 may include a heater for applying heat to the deposition material. Moreover, the source portion 60 may include a crucible for accommodating the deposition material. Here, the source portion 60 may stay still in the chamber 10 or may linearly move or reciprocate in a direction in the chamber 10. Here, when the source portion 60 moves, a source driver (not shown) for linearly moving and reciprocating the source portion 60 may be arranged in the chamber 10. In this case, the source driver may include a linear motor. Hereinafter, a case in which the source portion 60 is fixed in the chamber 10 will be described in detail for convenience of description.

The vision portion 80 is arranged in the chamber 10 to capture an image of at least one of the display substrate D, the first mask assembly 40, and the second mask assembly 50. The display substrate D and the first mask assembly 40 may be aligned or the display substrate D and the second mask assembly 50 may be aligned based on data obtained by the vision portion 80.

The pressure adjuster 70 may be connected to the chamber 10 to adjust a pressure in the chamber 10. The pressure adjuster 70 may include a guide pipe 71 connected to the chamber 10, and a vacuum pump 72 disposed in the guide pipe 71 to adjust the pressure in the chamber 10. In this case, a gas in the chamber 10 may be discharged to the outside or an additional gas may be supplied into the chamber 10 according to an operation of the vacuum pump 72.

Figure 4:
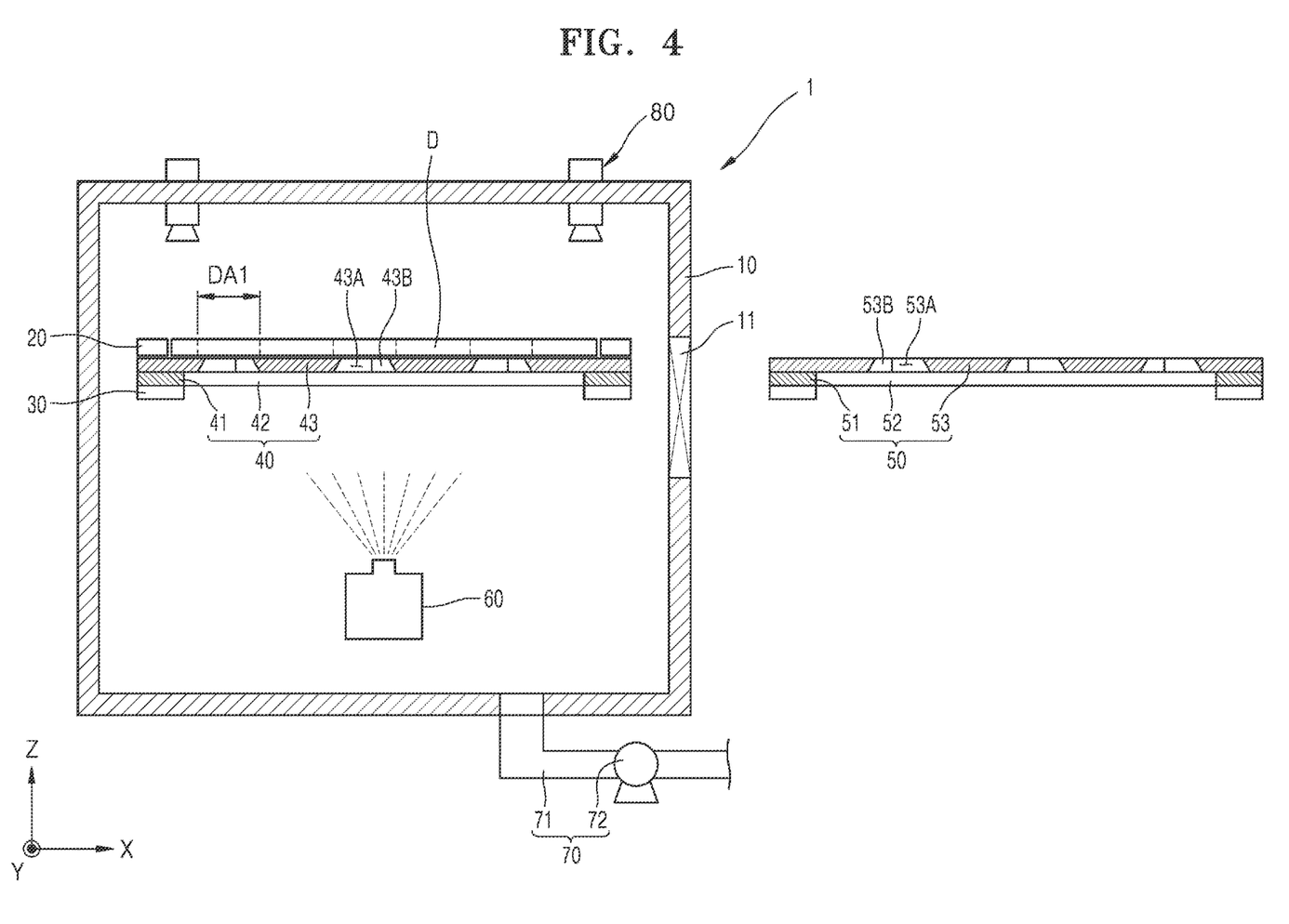
FIG. 4 is a cross-sectional view illustrating operations of the apparatus for manufacturing the display apparatus of FIG. 1.
Figure 5:
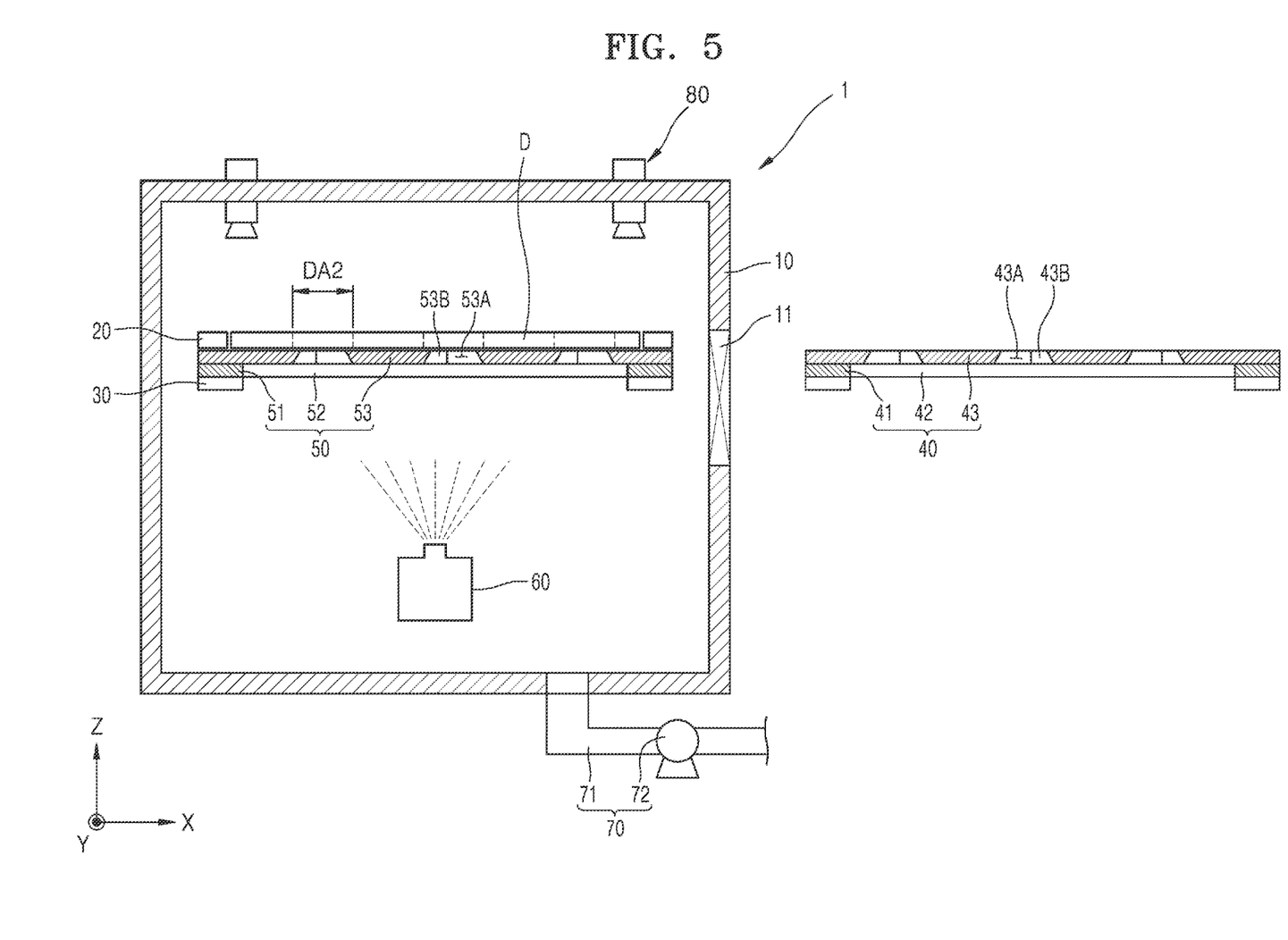
FIG. 5 is a cross-sectional view illustrating operations of the apparatus for manufacturing the display apparatus of FIG. 1.

FIG. 4 is a cross-sectional view illustrating operations of the apparatus 1 for manufacturing the display apparatus of FIG. 1. FIG. 5 is a cross-sectional view illustrating operations of the apparatus 1 for manufacturing the display apparatus of FIG. 1.

Referring to FIGS. 4 and 5, when the display apparatus (not shown) is manufactured by using the apparatus 1 for manufacturing the display apparatus, the display substrate D may be arranged in the chamber 10. Here, one of the first mask assembly 40 and the second mask assembly 50 may be arranged in the chamber 10. Hereinafter, a case in which the first mask assembly 40 is arranged in the chamber 10 to perform a deposition and then the second mask assembly 50 is arranged in the chamber 10 to perform a deposition will be described for convenience of description.

In the above case, the display substrate D may be on the first supporter 20, and the first mask assembly 40 may be on the second supporter 30.

When the display substrate D and the first mask assembly 40 are arranged as above, an alignment mark of the display substrate D and an alignment mark of the first mask assembly 40 are photographed by the vision portion 80 and compared with each other to align the display substrate D and the first mask assembly 40 with each other. Here, the second supporter 30 may finely adjust the position of the first mask assembly 40.

The source portion 60 may operate to supply the deposition material into the chamber 10. Here, the deposition material may be deposited on the display substrate D after passing through the first openings 43A. In this case, other portions of the first mask 43, except for the first openings 43A, do not include additional holes formed therein, and thus, the deposition material may be blocked. Moreover, the first protrusions 43B may block the deposition material. In this case, the deposition material that has passed through the first opening 43A may be deposited on the first deposition area DA1 in the display area (not shown) of the display substrate D. Here, the first deposition area DA1 may be a part of the display area. Also, the deposition material blocked by the first protrusion 43B may not be deposited on the display substrate D, but may configure a part of the first opening region (not shown).

During the above operations, the vacuum pump 72 operates to discharge the gas in the chamber 10 to the outside of the chamber 10.

After the above processes, the first mask assembly 40 may be withdrawn out of the chamber 10. Here, the vacuum pump 72 operates to adjust the pressure in the chamber 10 to be identical with or similar to the atmospheric pressure.

After withdrawing the first mask assembly 40 out of the chamber 10, the second mask assembly 50 may be inserted to the chamber 10. Here, the gate valve 11 may open the chamber 10, and a robot arm, etc. may withdraw the first mask assembly 40 to the outside of the chamber 10 or may insert the second mask assembly 50 into the chamber 10.

When the second mask assembly 50 is arranged on the second supporter 30, the vision portion 80 photographs the alignment mark of the display substrate D and an alignment mark of the second mask assembly 50 and the display substrate D and the second mask assembly 50 may be aligned with each other based on the captured image.

The source portion 60 may supply the deposition material again, and the deposition material may be deposited on the display substrate D through the second openings 53A. In this case, the deposition material that has passed through the second openings 53A may be deposited on a second deposition area DA2 in the display area.

The second deposition area DA2 may be a part of the display area and may configure one display area with the first deposition area DA1. In this case, the first deposition area DA1 and the second deposition area DA2 may at least partially overlap with each other to form an overlapping region (not shown). Here, a thickness of the deposition material in the first deposition area DA1 at the overlapping region may be less than that of the deposition material in the other portion of the first deposition area DA1. In particular, the thickness of the deposition material in the first deposition area DA1 at the overlapping region may be reduced towards a center of the second deposition area DA2. A thickness of the deposition material in the second deposition area DA2 at the overlapping region may be less than that of the deposition material in the other portion of the second deposition area DA2. When the deposition material is ejected from the deposition source in the deposition process, the mask and the substrate are slightly separated from each other so that part of the deposition material is blocked by the edge of the opening portion of the mask, for example, an uneven portion of the mask. Accordingly, the deposition material is less deposited in a portion of the substrate far from the edge of the opening portion of the mask than a portion of the substrate closer to the edge of the opening portion of the mask. As a result, the thickness of at least a portion of the edge is less than that of the other portion.

In this case, the thickness of the deposition material in the second deposition area DA2 at the overlapping region may be reduced towards a center of the first deposition area DA1. A boundary of the first deposition area DA1 and a boundary of the second deposition area DA2 in the overlapping region may correspond to the concavo-convex shape of the first opening 43A and the concavo-convex shape of the second opening 53A, respectively. Here, the second protrusion 53B blocks the deposition material to form the other portion of the first opening region (not shown).

As described above, when the deposition material is deposited on the display substrate D, the first deposition area DA1 and the second deposition area DA2 may be connected to each other via the overlapping region to form one display area. Also, the first protrusion 43B and the second protrusion 53B may form the first opening region. In this state, the deposition material may not be deposited on the first opening region.

After that, the display substrate D may be discharged to the outside of the chamber 10, and then a new display substrate D is inserted into the chamber 10 and the above processes may be repeatedly performed. In this case, since the second mask assembly 50 is arranged in the chamber 10, the deposition material may be deposited on the display substrate D through the second mask assembly 50, and after that, the deposition material may be deposited on the display substrate D through the first mask assembly 40.

The display substrate D on which the deposition material is deposited as described above may obtain a second opening region (not shown) when a hole is formed by irradiating a laser to the first opening region or by mechanically polishing the first opening region. Here, the first opening region and the second opening region may be integrally manufactured with each other and may be connected to each other. Moreover, the second opening region that is fabricated later may be smaller than the first opening region.

When the above processes are finished, a thin film encapsulation layer may be located on the display substrate D on which the deposition material is deposited.

Therefore, according to the apparatus 1 for manufacturing the display apparatus and the method of manufacturing the display apparatus, the display apparatus including opening regions may be manufactured. Also, according to the apparatus 1 and method of manufacturing the display apparatus, applying of the deposition material to an opening region may be prevented by a simple structure, and thus, foreign matter that may be generated when forming the opening region may be reduced.

Figure 6:
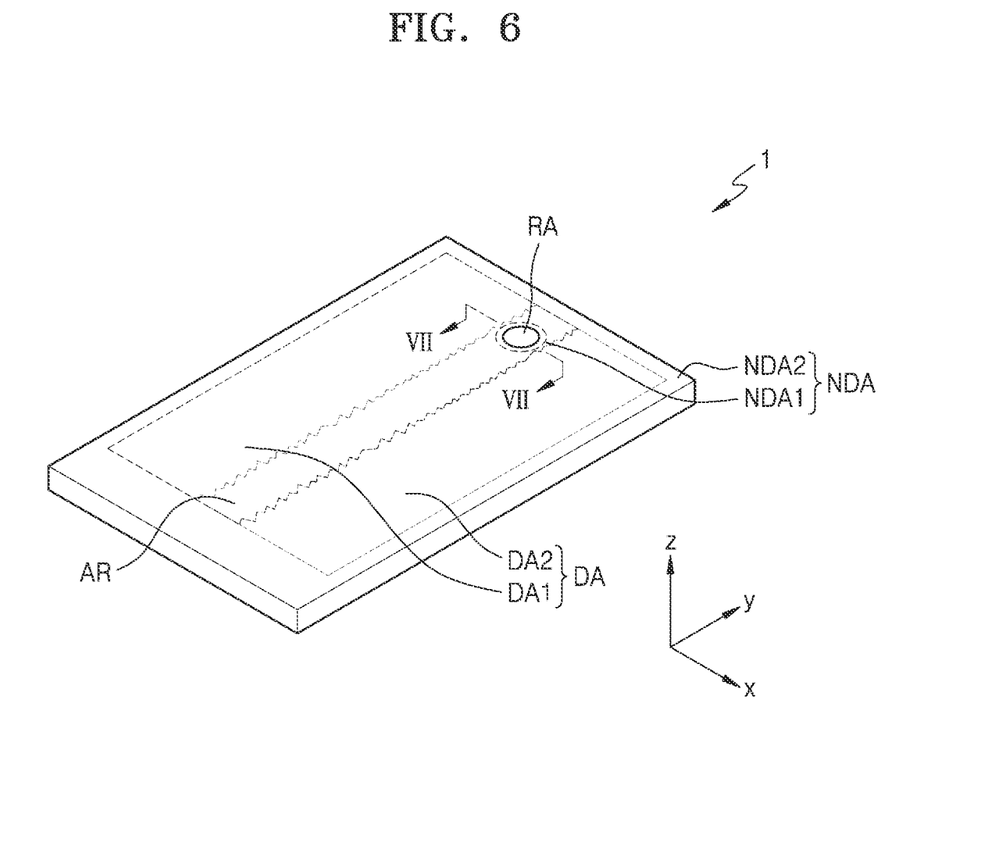
FIG. 6 is a plan view of a display apparatus manufactured by the apparatus for manufacturing the display apparatus of FIG. 1.
Figure 7:
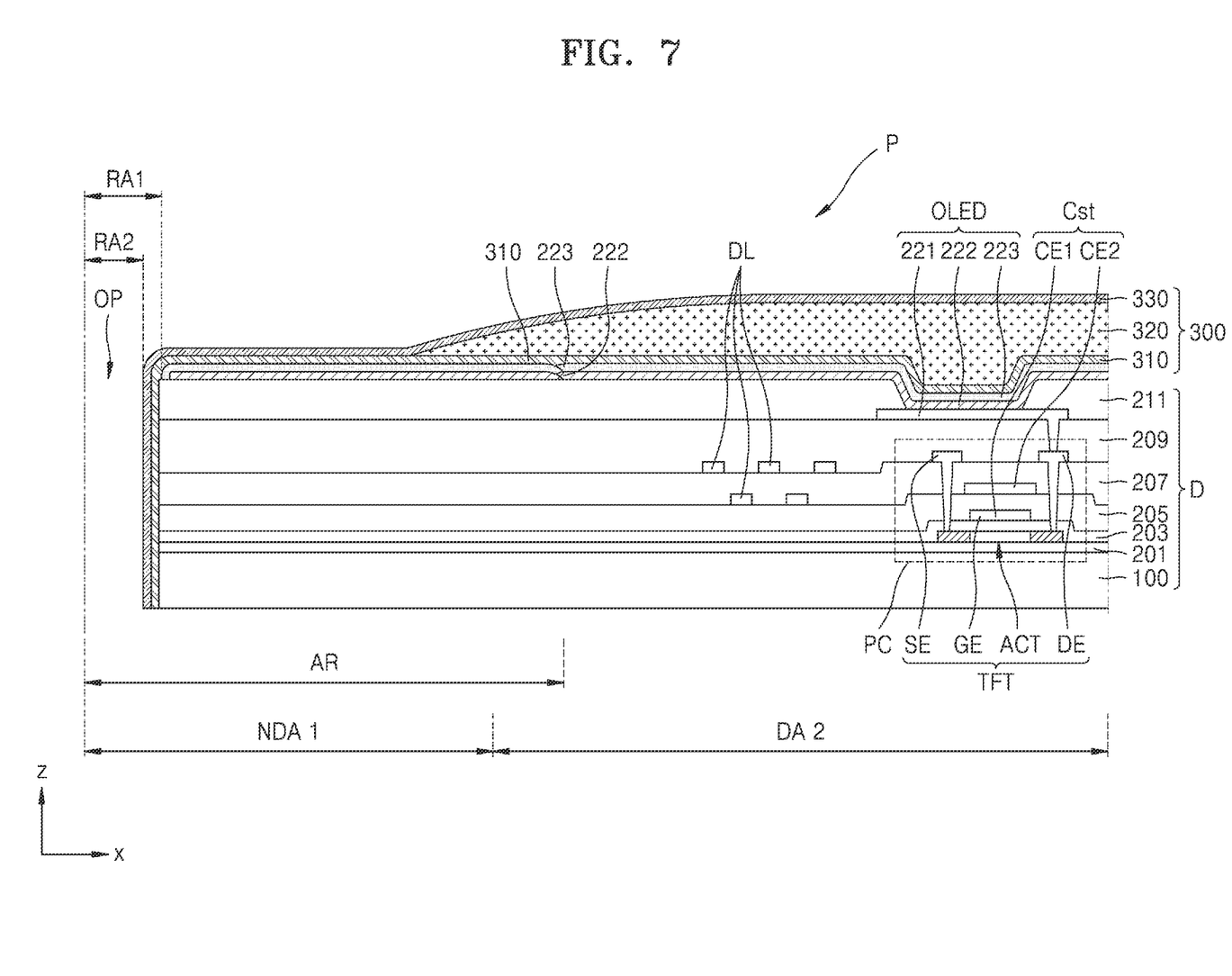
FIG. 7 is a cross-sectional view taken along a line VII-VII of FIG. 6.
Figure 8:
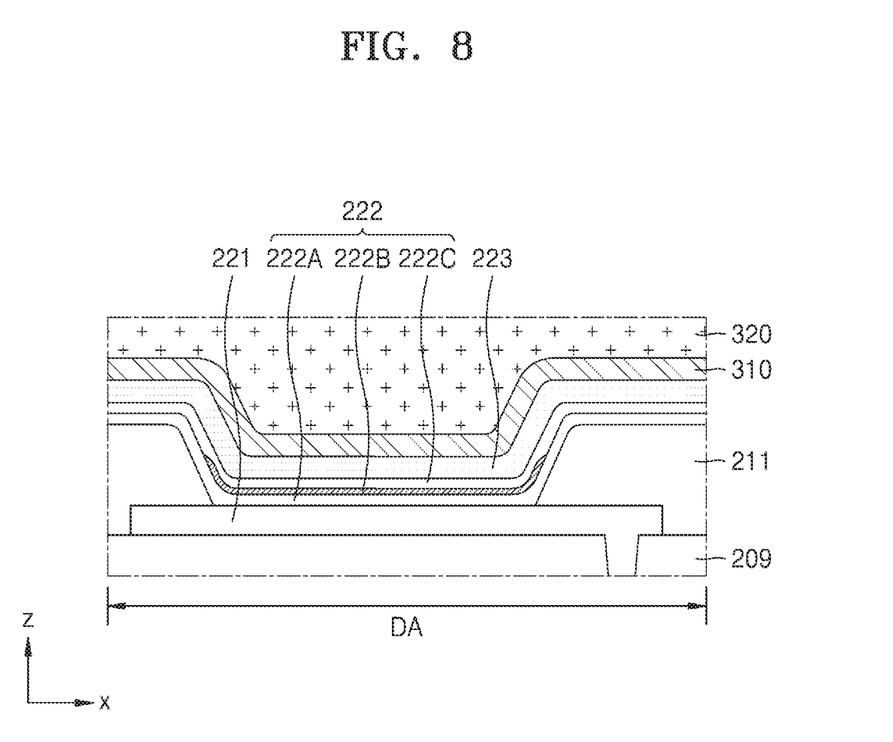
FIG. 8 is a cross-sectional view showing an enlarged view of an organic light-emitting device of FIG. 7.

FIG. 6 is a plan view of a display apparatus manufactured by the apparatus 1 for manufacturing the display apparatus of FIG. 1. FIG. 7 is a cross-sectional view taken along a line VII-VII of FIG. 6. FIG. 8 is a cross-sectional view showing an enlarged view of an organic light-emitting device of FIG. 7.

Referring to FIGS. 6 to 8, a display apparatus (not shown) may include a display panel P and an electronic element (not shown) corresponding to an opening region RA of the display panel P. Here, the opening region RA may be the same as a second opening region RA2. Although not shown in the drawings, component(s) such as an input sensing member for sensing a touch input, an anti-reflection member including a polarizer and a retarder, or a color filter and a black matrix, a transparent window, etc. may be further arranged on the display panel P. Here, the electronic element may be arranged in an opening OP that will be described later or an outer portion of the opening OP.

The display panel P may include a substrate 100, a display element layer (not denoted) arranged on the substrate 100 and including display elements, and a thin film encapsulation layer 300 that is a sealing member for covering the display element layer.

The substrate 100 may include a transparent glass material containing $SiO_2$ as a main component. The display element layer may include display elements such as an organic light-emitting diode (OLED) arranged on a display area DA. Although not shown in the drawings, the display element layer may include circuits and wirings electrically connected to the OLED that is the display element. The thin film encapsulation layer 300 covers the display element layer in order to prevent external moisture or contamination materials from infiltrating into the display element layer. The thin film encapsulation layer 300 may include at least one inorganic encapsulation layer and at least one organic encapsulation layer.

The display panel P may include the opening OP corresponding to the opening region RA and penetrating therethrough. The substrate 100, the display element layer, and the thin film encapsulation layer 300 may have openings corresponding to the opening region RA, wherein the openings may form the opening OP of the display panel P.

The opening region RA is a portion where the electronic element is arranged, and the electronic element may correspond to the openings in the substrate 100, the display element layer, and the thin film encapsulation layer 300. The opening of the substrate 100 penetrates through upper and lower surfaces of the substrate 100, the opening of the display element layer penetrates through lowermost and uppermost layers of the display element layer, and the opening of the thin film encapsulation layer 300 penetrates through the thin film encapsulation layer 300.

The electronic element may use light or sound. For example, the electronic element may include a light-receiving sensor such as an infrared-ray (IR) sensor, a camera capturing an image by receiving light, a sensor for outputting and sensing light or sound to measure a distance or recognize a fingerprint, a small-sized lamp illuminating light, a speaker for outputting sound, etc. The electronic element using light may use light of various wavelength bands such as visible light, IR light, ultraviolet (UV) rays, etc.

The opening region RA may be appreciated as a transmission area, through which light and/or sound output from the electronic element or proceeding towards the electronic element from outside may transmit. In particular, when a portion in the display panel P corresponding to the opening region RA is completely removed, for example, when the opening OP penetrates through the display panel P, the light or sound output or received by the electronic element may be efficiently used.

Unlike the above example in which the substrate 100, the display element layer, and the thin film encapsulation layer 300 may each include an opening corresponding to the opening region RA, the substrate 100 may not include an opening.

Here, although the substrate 100 may not include an opening, the display element layer and the thin film encapsulation layer 300 respectively include openings, and thus a transmittance of light used by the electronic element may be ensured. For example, the light transmittance of the opening region RA in the display panel P may be equal to or greater than about 50%, for example, equal to or greater than about 70%, 75%, 70%, 85%, or 90%.

As another embodiment, the substrate 100 of the display panel P may include a polymer resin, and in this case, the substrate 100 may be more flexible than a substrate of a glass material. For example, the substrate 100 may include a first base material layer (not shown), a first inorganic layer (not shown), a second base material layer (not shown), and a second inorganic layer (not shown) that are sequentially stacked in the stated order.

The first and second base material layers may include a transparent polymer resin. The transparent polymer resin may include a polyether sulphone (PES), polyacrylate (PAR), polyetherimide (PEI), polyethylene naphthalate (PEN), polyethylene terephthalate (PET), polyphynylene sulfide (PPS), polyarylate, polyimide (PI), polycarbonate (PC), cellulose triacetate (TAC), cellulose acetate propionate (CAP), etc.

The first inorganic layer and the second inorganic layer include barrier layers for preventing infiltration of external impurities, and may each have a single-layered or multi-layered structure including silicon nitride (SiNx) and/or silicon oxide (SiOx).

The substrate 100 including polymer resin may or may not include an opening corresponding to the opening region RA. On the contrary, the display element layer and the thin film encapsulation layer 300 may each include an opening, as described above.

The display panel P includes a plurality of pixels (not shown) on the display area DA. The above pixels may each include an OLED. Each of the pixels may emit light, e.g., red light, green light, blue light, or white light, via the OLED.

A first non-display area NDA1 surrounds the opening region RA. The first non-display area NDA1 may be a region on which a display element such as an OLED that emits light is not arranged. A second non-display area NDA2 may include a scan driver (not shown) for providing each pixel with a scan signal, a data driver (not shown) for providing each pixel with a data signal, and a main power line (not shown) for supplying first and second power voltages.

A buffer layer 201 may be on the substrate 100 in order to prevent impurities from infiltrating into a semiconductor layer of a thin film transistor. The buffer layer 201 may include an inorganic insulating material such as SiNx or SiOx, and may have a single-layered or multi-layered structure including the above inorganic insulating material. In some embodiments, the second inorganic layer may be appreciated as a partial layer of the buffer layer 201 having the multi-layered structure.

A pixel circuit PC including a thin film transistor TFT, a storage capacitor Cst, etc. may be on the buffer layer 201. The thin film transistor TFT may include a semiconductor layer ACT, a gate electrode GE, a source electrode SE, and a drain electrode DE. The thin film transistor TFT may be a driving thin film transistor. In one embodiment, a top gate type transistor in which the gate electrode GE is on the semiconductor layer ACT with a gate insulating layer 203 provided therebetween is shown, but according to another embodiment, the thin film transistor TFT may be a bottom gate type transistor.

The semiconductor layer ACT may include polysilicon. Alternatively, the semiconductor layer ACT may include amorphous silicon, oxide semiconductor, organic semiconductor, etc. The gate electrode GE may include a low-resistive metal material. The gate electrode GE may include a conductive material including molybdenum (Mo), aluminum (Al), copper (Cu), titanium (Ti), etc., and may have a single-layered or multi-layered structure.

The gate insulating layer 203 is between the semiconductor layer ACT and the gate electrode GE. The gate insulating layer 203 may include an inorganic insulating material such as silicon oxide, silicon nitride, silicon oxynitride, aluminum oxide, titanium oxide, tantalum oxide, hafnium oxide, etc.

The source electrode SE and the drain electrode DE may include a highly conductive material. The source electrode SE and the drain electrode DE may include a conductive material including Mo, Al, Cu, Ti, etc., and may have a single-layered or multi-layered structure including the above materials. As an embodiment, the source electrode SE and the drain electrode DE may have a multi-layered structure including Ti/Al/Ti.

The storage capacitor Cst includes a lower electrode CE1 and an upper electrode CE2 overlapping with each other with a first interlayer insulating layer 205 therebetween. The storage capacitor Cst may overlap with the thin film transistor TFT. Regarding this, FIG. 7 shows a structure in which the gate electrode GE of the thin film transistor TFT is the lower electrode CE1 of the storage capacitor Cst, but one or more embodiments are not limited thereto. As another embodiment, the storage capacitor Cst may not overlap with the thin film transistor TFT. The storage capacitor Cst may be covered by a second interlayer insulating layer 207.

The first and second interlayer insulating layers 205 and 207 may each include inorganic insulating material such as silicon oxide, silicon nitride, silicon oxynitride, aluminum oxide, titanium oxide, tantalum oxide, hafnium oxide, etc.

The pixel circuit PC including the thin film transistor TFT and the storage capacitor Cst is covered by a first insulating layer 209. The first insulating layer 209 includes a planarized insulating layer, and may include a general universal polymer (polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. As an embodiment, the first insulating layer 209 may include polyimide. As an embodiment, the first insulating layer 209 may have a thickness of about 1.7 μm to about 2.4 μm.

An organic light-emitting diode OLED is on the first insulating layer 209. A pixel electrode 221 of the organic light-emitting diode OLED is on the first insulating layer 209, and may be connected to the pixel circuit PC via a contact hole of the first insulating layer 209.

The pixel electrode 221 may include a conductive oxide such as indium tin oxide (ITO), indium zinc oxide (IZO), zinc oxide (ZnO), indium oxide (In$_2$O$_3$), indium gallium oxide, or aluminum zinc oxide (AZO). As another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. As another embodiment, the pixel electrode 221 may further include a layer including ITO, IZO, ZnO, or In$_2$O$_3$ on/under the reflective layer.

A second insulating layer 211 includes an opening exposing an upper surface of the pixel electrode 221, but covers edges of the pixel electrode 221. The second insulating layer 211 includes an inorganic insulating material. For example, the second insulating layer 211 may include silicon oxide and/or silicon nitride, and may have a single-layered or multi-layered structure. The second insulating layer 211 may have a thickness that is less than that of the first insulating layer 209.

An intermediate layer 222 includes an emission layer 222B. The emission layer 222B may include a polymer or low-molecular weight organic material emitting a predetermined color light. As an embodiment, the intermediate layer 222 may include a first functional layer 222A under the emission layer 222B and/or a second functional layer 222C on the emission layer 222B, as shown in FIG. 8.

The first functional layer 222A may have a single-layered or multi-layered structure. For example, when the first functional layer 222A includes a polymer material, the first functional layer 222A includes a hole transport layer (HTL) having a single-layered structure, and may include poly-(3,4)-ethylene-dihydroxy thiophene (PEDOT) or polyaniline (PANI). When the first functional layer 222A includes a low-molecular weight material, the first functional layer 222A may include a hole injection layer (HIL) and an HTL.

The second functional layer 222C is an optional layer. For example, when the first functional layer 222A and the emission layer 222B include a polymer material, the second functional layer 222C may be provided in order to improve characteristics of the organic light-emitting diode OLED. The second functional layer 222C may have a single-layered or multi-layered structure. The second functional layer 222C may include an electron transport layer (ETL) and/or an electron injection layer (EIL).

Some of the plurality of layers included in the intermediate layer 222, e.g., the first and second functional layers 222A and 222C, may be arranged on the first non-display area NDA1, as well as the display area DA.

An opposite electrode 223 is arranged facing the pixel electrode 221 as the intermediate layer 222 is provided therebetween. The opposite electrode 223 may include a conductive material having a low work function. For example, the opposite electrode 223 may include a (semi-)transparent layer including Ag, Mg, Al, Pt, Pd, Au, Ni, Nd, Ir, Cr, lithium (Li), calcium (Ca), or an alloy thereof. Alternatively, the opposite electrode 223 may further include a layer including ITO, IZO, ZnO, or In$_2$O$_3$ on the (semi-)transparent layer including the above material. Here, the opposite electrode 223 may be located on the first non-display area NDA1, as well as the display area DA. As another embodiment, the opposite electrode 223 may be located only on the display area DA. Hereinafter, a case in which the opposite electrode 223 is located only on the display area DA will be described in detail for convenience of description.

The organic light-emitting diode OLED is covered by the thin film encapsulation layer 300. The thin film encapsulation layer 300 may include at least one organic encapsulation layer and at least one inorganic encapsulation layer. In FIG. 7, the thin film encapsulation layer 300 includes first and second inorganic encapsulation layers 310 and 330 and an organic encapsulation layer 320 between the first and second inorganic encapsulation layers 310 and 330, but a stacking order and the number of layers may vary.

The first and second inorganic encapsulation layers 310 and 330 may include one or more inorganic insulating materials from aluminum oxide, titanium oxide, tantalum oxide, hafnium oxide, zinc oxide, silicon oxide, silicon nitride, and silicon oxynitride, and may be manufactured by chemical vapor deposition (CVD). The organic encapsulation layer 320 may include a polymer-based material. The polymer-based material may include an acryl-based resin, an epoxy-based resin, polyimide, polyethylene, etc.

Data lines DL may be alternately arranged as an insulating layer is provided therebetween. Data lines DL adjacent to each other may be respectively located on and under an insulating layer (e.g., the second interlayer insulating layer 207).

The above display apparatus may be manufactured by using the apparatus 1 and method of manufacturing the display apparatus illustrated above with reference to FIGS. 1 to 5.

In detail, when at least one of the first and second functional layers 222A and 222C and the opposite electrode 223 is manufactured by using the apparatus (not shown) for manufacturing the display apparatus, the first mask assembly (not shown) and the second mask assembly (not shown) described above may be used. Here, at least one of the first and second functional layers 222A and 222C and the opposite electrode 223 may be separately fabricated through at least two operations. Hereinafter, a case in which at least one of the first and second functional layers 222A and 222C and the opposite electrode 223 is separately fabricated through at least two operations will be described for convenience of description. Also, a case in which the first and second functional layers 222A and 222C are manufactured will be described for convenience of description.

When the first and second functional layers 222A and 222C are manufactured, as described above, the deposition material may be deposited on the display substrate D through one of the first mask assembly 40 and the second mask assembly 50. Here, the display substrate D may include the substrate 100, the buffer layer 201, the gate insulating layer 203, the thin film transistor TFT, the second interlayer insulating layer 207, the first insulating layer 209, the second insulating layer 211, and the pixel electrode 221. As another embodiment, the display substrate D may further include the first functional layer 222A and the emission layer 222B, in addition to the above layers. In this case, both the first functional layer 222A and the second functional layer 222C may be manufactured by the apparatus 1 for manufacturing the display apparatus described above. Hereinafter, a case in which the second functional layer 222C is manufactured on the display substrate D will be described in detail for convenience of description.

As described above, the second functional layer 222C may be deposited on the display substrate D by using one of the first mask assembly 40 and the second mask assembly 50, and then, may be deposited on the display substrate D by using the other of the first mask assembly 40 and the second mask assembly 50.

In this case, the second functional layer 222C may not be deposited on the opening region RA because the second functional layer 222C is blocked by the first protrusion 43B (not shown) and the second protrusion 53B (not shown). As another embodiment, the second functional layer 222C may not be deposited on the first non-display area NDA1 surrounding the opening region RA, due to the first protrusion 43B and the second protrusion 53B.

In the above case, the deposition material that has passed through a first opening 43A (not shown) is deposited on the first deposition area DA1 and the deposition material that has passed through the second opening 53A (not shown) may be deposited on the second deposition area DA2 to obtain the second functional layer 222C. Here, the first deposition area DA1 and the second deposition area DA2 may at least partially overlap with each other to form an overlapping region AR. In this case, a boundary of the overlapping region AR may include a part of the boundary of the first deposition area DA1 and a part of the boundary of the second deposition area DA2. In this case, the boundary of the overlapping region AR may have a straight line shape or a concavo-convex shape. Here, a part of the boundary of the overlapping region AR may have a concavo-convex shape, and the concavo-convex shape may be atypical. In particular, the boundary of the overlapping region AR having the concavo-convex shape may be in the first deposition area DA1 and the second deposition area DA2.

Unlike the above example, when the overlapping region AR is not provided, the boundary of the first deposition area DA1 and the boundary of the second deposition area DA2 facing each other may not be connected to each other, which may allow a user to recognize the boundary. Also, even when the facing boundaries of the first deposition area DA1 and the second deposition area DA2 abut each other, a boundary between the first deposition area DA1 and the second deposition area DA2 may be visible from outside the display apparatus.

However, the visible boundary may be prevented when the overlapping region AR is provided as described above. In particular, when the boundary of the overlapping region AR has a part of the concavo-convex shape that is atypical, the visibility of the boundary may decrease.

As described above, after forming the second functional layer 222C, the opposite electrode 223 may be located on the second functional layer 222C. The opposite electrode 223 may be provided similarly to the second functional layer 222C. In this case, in the opening region RA, a first opening region RA1 where the first functional layer 222A, the second functional layer 222C, and the opposite electrode 223 are not provided may be generated.

After that, the thin film encapsulation layer 300 is located on the opposite electrode 223 to manufacture the display panel P. In this case, at least a part of the thin film encapsulation layer 300 is arranged on an internal surface of the first opening region RA1 to shield at least a part of the first opening region RA1 from the outside.

After that, a laser beam may be irradiated on the first opening region RA1 or the first opening region RA1 may be mechanically polished to form the second opening region RA2, and then forming of the opening region RA may be finished. In this case, the second opening region RA2 may penetrate through the substrate 100 and the other layers.

Therefore, in the display apparatus, a part of the boundary of the overlapping region AR may not be visible to the user on the outer portion of the display apparatus even when the display area DA is separately deposited. Also, according to the display apparatus, gas or impurities generated when a laser is used to form the second opening region RA2 may be reduced, and a thermal deformation of the first and second functional layers 222A and 222C due to the heat applied to the first and second functional layers 222A and 222C may be prevented.

Figure 9:
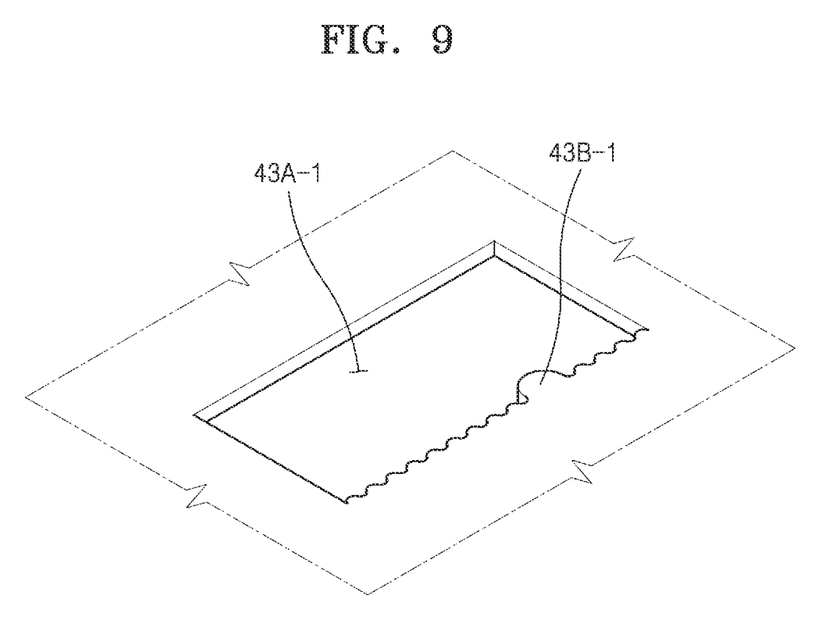
FIG. 9 is a perspective view of a first opening according to an embodiment.

FIG. 9 is a perspective view of a first opening 43A-1 according to an embodiment.

Referring to FIG. 9, an apparatus (not shown) for manufacturing a display apparatus may be similar to that illustrated above with reference to FIGS. 1 to 4. Here, a boundary of the first opening 43A-1 and a boundary of a second opening (not shown) may each partially have a concavo-convex shape. The concavo-convex shape may be atypical. Here, since the concavo-convex shape in the boundary of the first opening 43A-1 and the concavo-convex shape in the boundary of the second opening are opposite to each other to be coupled to each other, the concavo-convex shape in the boundary of the first opening 43A-1 will be described in detail for convenience of description.

The concavo-convex shape in the boundary of the first opening 43A-1 may be a predetermined pattern shapes. For example, the concavo-convex shape in the boundary of the first opening 43A-1 may include at least two protrusions and two recesses, and two different protrusions may have the same sizes and shapes as each other. In this case, edges of the protrusions may be straight lines. Here, the protrusions may have rectangular shapes as shown in FIG. 9.

As described above, when the concavo-convex shape is provided in the boundary of the first opening 43A-1, a first deposition area (not shown) formed by the first opening 43A-1 may have a similar shape to that of the first opening 43A-1. Here, a first protrusion 43B-1 may protrude towards an inner portion of the first opening 43A-1. The first protrusion 43B-1 blocks the deposition material to form an opening region (not shown).

In addition, the second opening may be arranged at a different location from the first opening 43A-1, and as described above, the second opening may form a second deposition area (not shown). Here, the second deposition area may configure a display area (not shown) together with the first deposition area.

As described above, when the first opening 43A-1 and the second opening have the above concavo-convex shapes, the concavo-convex shapes in the display apparatus manufactured as above may not be visible to the user, and the overlapping region between the first deposition area and the second deposition area may not be recognized by the user on the outer portion of the display apparatus.

Figure 10:
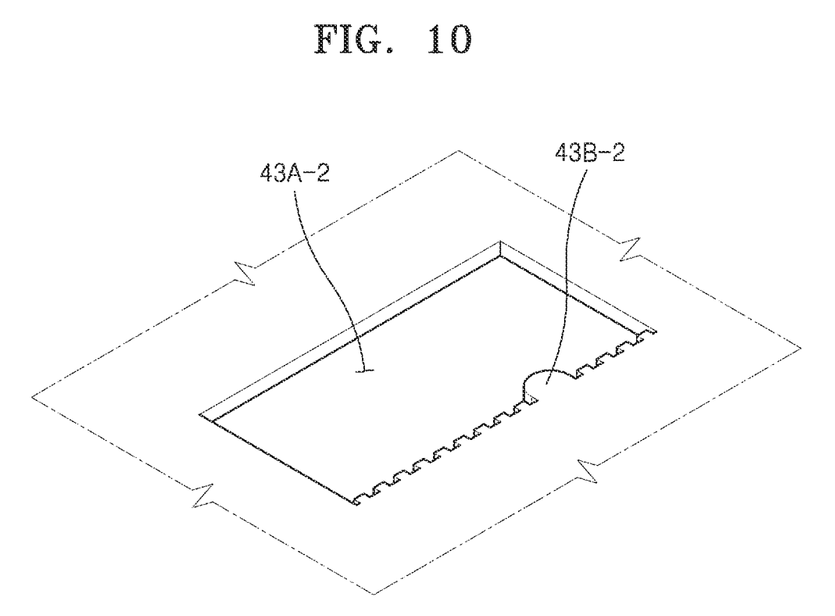
FIG. 10 is a perspective view of a first opening according to an embodiment.

FIG. 10 is a perspective view of a first opening 43A-2 according to an embodiment.

Referring to FIG. 10, a boundary of the first opening 43A-2 may partially have a concavo-convex shape of a curved type. In this case, the concavo-convex shape of the first opening 43A-2 may have various curves such as a sine wave, a cosine wave, etc.

A concavo-convex shape of a second opening (not shown) may be opposite to the concavo-convex shape of the first opening 43A-2. For example, when the first opening 43A-2 and the second opening are located opposite to each other based on an arbitrary line, the concavo-convex shape of the first opening 43A-2 and the concavo-convex shape of the second opening may meet each other. That is, protrusions in the concavo-convex shape of the first opening 43A-2 may be inserted to recesses in the concavo-convex shape of the second opening, and protrusions in the concavo-convex shape of the second opening may be inserted to recesses in the concavo-convex shape of the first opening 43A-2.

A first protrusion 43B-2 may protrude in the first opening 43A-2. Here, the first protrusion 43B-2 may form an opening region (not shown) described above.

In the above case, a display area (not shown) formed by the first opening 43A-2 and the second opening includes an overlapping region (not shown) as described above, and a visibility of a boundary of the overlapping region may noticeably decrease due to the concavo-convex shape.

Therefore, high quality of the display apparatus may be maintained even when the opening region is provided.

According to one or more embodiments, various electronic elements may be arranged because the opening is formed.

According to one or more embodiments, gas or impurities generated during the forming of the opening may be reduced.

According to one or more embodiments, a part of the opening may be formed by using a simple structure.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    arranging a display substrate and a first mask assembly in a chamber;
    depositing a deposition material on a part of the display substrate through a first opening of the first mask assembly to form a first deposition area surrounding a part of an opening region;
    arranging a second mask assembly in the chamber after withdrawing the first mask assembly out of the chamber; and
    depositing the deposition material on a different part of the display substrate through a second opening of the second mask assembly to form a second deposition area surrounding a different part of the opening region,
    wherein the first deposition area and the second deposition area are connected to each other to at least partially surround the opening region.

2. The method of claim 1, wherein the first deposition area and the second deposition area at least partially overlap with each other.

3. The method of claim 2, wherein at least one of a boundary of the first deposition area overlapping with the second deposition area and a boundary of the second deposition area overlapping with the first deposition area has a concavo-convex shape.

4. The method of claim 3, wherein the concavo-convex shape is atypical.

5. The method of claim 2, wherein a concavo-convex shape in a boundary of the first deposition area and a concavo-convex shape in a boundary of the second deposition area are coupled to each other.

6. The method of claim 1, wherein the first mask assembly comprises a first opening corresponding to the first deposition area and a first protrusion protruding towards an inner portion of the first opening to block a part of the opening region.

7. The method of claim 6, wherein a boundary of the first opening connected to the first protrusion has a concavo-convex shape.

8. The method of claim 1, wherein the second mask assembly comprises a second opening corresponding to the second deposition area and a second protrusion protruding towards an inner portion of the second opening to block a part of the opening region.

9. The method of claim 8, wherein a boundary of the second opening connected to the second protrusion has a concavo-convex shape.

* * * * *